(12) United States Patent
Beroz

(10) Patent No.: US 8,039,959 B2
(45) Date of Patent: Oct. 18, 2011

(54) MICROELECTRONIC CONNECTION COMPONENT

(75) Inventor: Masud Beroz, Cary, NC (US)

(73) Assignee: Tessera, Inc., San Jose, CA (US)

( * ) Notice: Subject to any disclaimer, the term of this patent is extended or adjusted under 35 U.S.C. 154(b) by 719 days.

(21) Appl. No.: 11/580,750

(22) Filed: Oct. 13, 2006

(65) Prior Publication Data

US 2007/0108613 A1    May 17, 2007

Related U.S. Application Data

(63) Continuation-in-part of application No. 11/013,965, filed on Dec. 15, 2004, now abandoned.

(60) Provisional application No. 60/532,345, filed on Dec. 23, 2003.

(51) Int. Cl.
*H01L 23/48* (2006.01)

(52) U.S. Cl. ........ 257/738; 257/787; 257/697; 257/666; 257/678; 257/E23.031

(58) Field of Classification Search .................. 257/738, 257/787, 697, 666, 678, E23.061
See application file for complete search history.

(56) References Cited

U.S. PATENT DOCUMENTS

| | | | |
|---|---|---|---|
| 6,373,131 B1 * | 4/2002 | Karnezos | 257/712 |
| 6,489,682 B1 * | 12/2002 | Yeh et al. | 257/738 |
| 6,812,580 B1 * | 11/2004 | Wenzel et al. | 257/784 |
| 6,836,011 B2 | 12/2004 | Azuma | |
| 2004/0027869 A1 | 2/2004 | Miwa et al. | |
| 2005/0022379 A1 | 2/2005 | Rumsey et al. | |

* cited by examiner

*Primary Examiner* — Junghwa M Im
(74) *Attorney, Agent, or Firm* — Lerner, David, Littenberg, Krumholz & Mentlik, LLP

(57) ABSTRACT

A microelectronic connection component includes a substrate having a first surface, a second surface and a peripheral edge. First and second terminals are exposed at the first surface of the substrate. Wire bond pads are exposed proximate the peripheral edge of the substrate at the first surface. First conductive paths couple the first terminals to the wire bond pads. Bonding leads extend beyond the peripheral edge of the substrate. Second conductive paths couple the second terminals to the bonding leads.

21 Claims, 5 Drawing Sheets

MICROELECTRONIC CONNECTION COMPONENT

CROSS-REFERENCE TO RELATED APPLICATIONS

The present application is a continuation-in-part of U.S. patent application Ser. No. 11/013,965, filed Dec. 15, 2004, which application claims the benefit of the filing date of U.S. Provisional Patent Application No. 60/532,345, filed Dec. 23, 2003, the disclosures of which are hereby incorporated by reference herein.

FIELD OF THE INVENTION

The present invention relates to microelectronics and, more particularly, to a microelectronic connection component.

BACKGROUND OF THE INVENTION

A microelectronic element, such as a semiconductor chip, typically is connected to external circuitry through contacts on the surface of the element. The contacts may be disposed in rows extending along the edges of the chip's front surface. Each such contact may be connected to an external circuit element such as a circuit trace on a supporting substrate or circuit panel.

The rapid evolution of microelectronic elements has created continued demand for incorporation of progressively greater numbers of contacts and leads in a given amount of space.

SUMMARY OF THE INVENTION

One aspect of the invention includes a microelectronic connection component with a substrate including, for example, a dielectric material. The substrate has a first surface, a second surface and a peripheral edge. First and second terminals are exposed at the first surface. Wire bond pads are exposed proximate the peripheral edge at the first surface. First conductive paths couple the first terminals to the wire bond pads. Bonding leads extend beyond the peripheral edge of the substrate. Second conductive paths couple the second terminals to the bonding leads.

In some implementations the bonding leads extend from the second surface of the substrate. In those instances, the second terminals can be disposed on the first surface and the second conductive paths can include plated through holes that extend from the second terminals through the substrate. Conductive traces can extend along the second surface of the substrate from the plated through holes to the bonding leads. Alternatively, the second terminals can be disposed on the second surface of the substrate and the second conductive paths can include conductive traces that extend along the second surface of the substrate from the second terminals to the bonding leads.

In some implementations the second conductive paths are disposed on the second surface of the substrate and in some implementations the first conductive paths are disposed on the first surface of the substrate.

In a typical implementation at least some of the wire bond pads surround at least some of the first terminals and at least some of the first terminals surround at least some of the second terminals. In some implementations at least some of the first terminals are disposed between at least some of the second terminals and at least some of the wire bond pads.

In a typical implementation the bonding leads are adapted to flex in a direction that facilitates coupling to bonding lead contacts exposed at a surface of a microelectronic element coupled to the microelectronic connection component. Additionally, the first and second terminals typically are arranged so as to align with and be coupled to mating contacts exposed at a surface of a circuit board coupled to the microelectronic connection component.

Another aspect of the invention includes a microelectronic assembly that includes a microelectronic connection component as discussed above and a microelectronic element, for example a semiconductor device, coupled to the microelectronic connection component. The microelectronic element includes wire bond contacts and bonding leads contacts adjacent the wire bond contacts. The wire bond pads are electrically coupled to the wire bond contacts and the bonding leads are electrically coupled to the bonding lead contacts.

In some implementations wire bonds couple the wire bond pads to the wire bond contacts. In certain implementations the bonding leads are bent to touch the bonding lead contacts. According to some implementations the wire bond contacts and the bonding leads contacts respectively form rows that are substantially parallel to one another.

A circuit board can be coupled to the microelectronic connection component with the first and second terminals being aligned with and coupled to mating contacts exposed at a surface of the circuit board that faces the microelectronic connection component.

In some implementations, an increase in the input/output capability of a microelectronic element may be realized without needing a corresponding increase in required space. Accordingly, more efficient use of space inside a microelectronic assembly is realized.

Other features and advantages will be readily apparent from the following description, the accompanying drawings and the claims.

BRIEF DESCRIPTION OF THE DRAWINGS

Like reference symbols in the various drawings indicate like elements.

DETAILED DESCRIPTION

Figure 1:
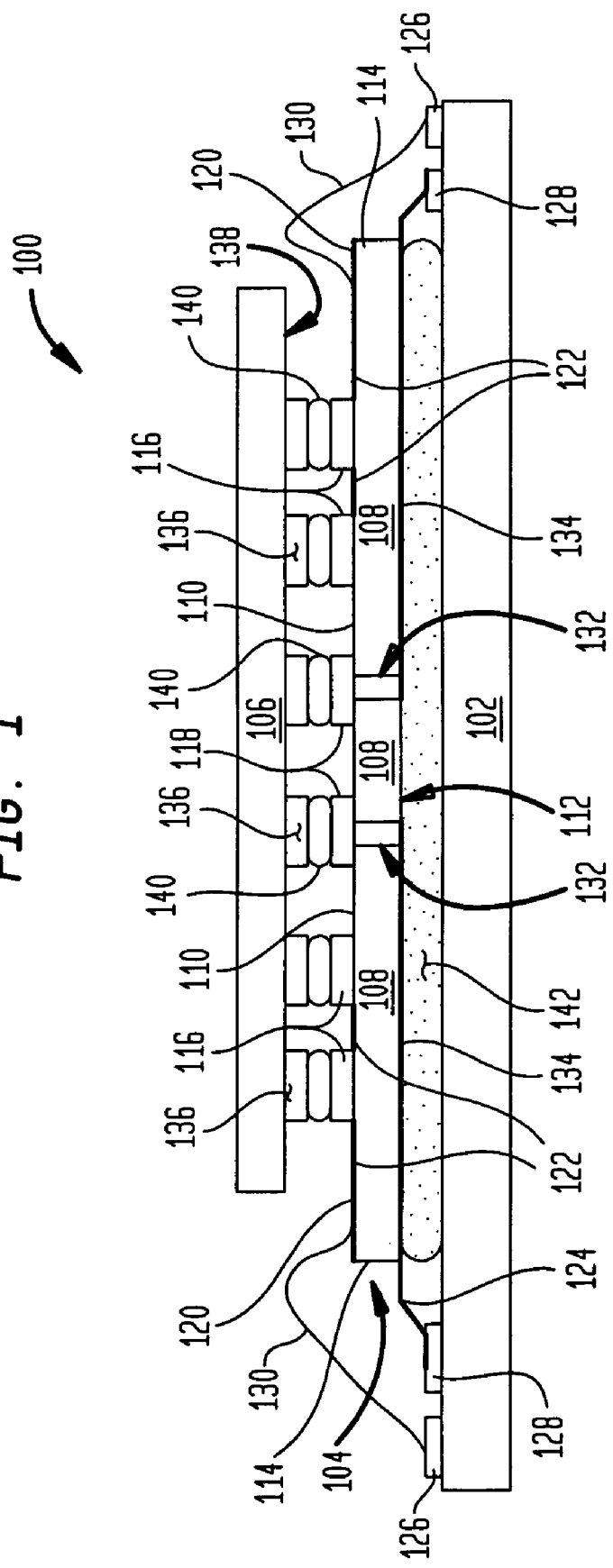
FIG. 1 is a diagrammatic sectional view of a microelectronic assembly.

FIG. 1 is a diagrammatic sectional view of a microelectronic assembly 100 that includes a microelectronic element 102, a microelectronic connection component 104 coupled to the microelectronic element 102 and a circuit board 106 coupled to the microelectronic connection component 104.

The illustrated microelectronic connection component 104 includes a substrate 108 having a first surface 110, a second surface 112 and peripheral edges 114. In some implementations, the substrate 108 includes a dielectric material. First and second terminals 116, 118 are disposed on and exposed at the first surface 110 of the substrate 108. Wire bond pads 120 are exposed proximate peripheral edges 114 of the substrate 108 at the first surface 110. First conductive paths couple the first terminals 116 to the wire bond pads 120. In the illustrated implementation, the first conductive paths include conductive traces 122 that extend along the first surface 110 of the substrate 108. Bonding leads 124 extend beyond peripheral edges 114 of the substrate 108. Second conductive paths couple the second terminals 118 to the bonding leads 124.

According to the illustrated implementation, the microelectronic element 102 has wire bond contacts 126 and bonding lead contacts 128 exposed at an upper surface thereof. The wire bond contacts 126 are electrically coupled to the wire bond pads 120 of the microelectronic connection component 104 by wire bonds 130.

The bonding lead contacts 128 are positioned adjacent the wire bond contacts 126 and are electrically coupled to the bonding leads 124 of the microelectronic connection component 104. The bonding leads 124 are disposed on and extend outward from the second surface 112 of the substrate 108. In some implementations, the bonding leads 124 are adapted to flex in a direction that facilitates coupling to the bonding lead contacts 128. For example, in the illustrated implementation, the bonding leads 124 are shown in flexed or bent positions so that distal portions of those bonding leads 124 touch associated bonding lead contacts 128 on the microelectronic element 102. The distal ends are bonded to the associated bonding lead contacts 128. In some implementations, the bonding leads 124 are soldered to the bonding lead contacts 128.

According to the illustrated implementation, the first conductive paths include conductive traces 122 disposed on the first surface 110 of the substrate 108. The second conductive paths include vertical conductors in the form of plated through holes 132 (i.e., vias) that extend from the second terminals 118, through the substrate 108 to the conductive traces 134 exposed at the second surface 112 of the substrate 108. The second conductive paths also include the conductive traces 134 that extend from the plated through holes 132 to the bonding leads 124.

In the illustrated implementation, the first terminals 116 are disposed on the first surface 110 between at least one of the second terminals 118 and at least one of the wire bond pads 122. In particular, the second terminals 118 are centrally located on the first surface 110, the first terminals 116 surround the second terminals 118 and the wire bond pads 122 surround the first terminals 116. Other terminal/pad arrangements are possible.

In some implementations, the microelectronic element 102 includes a semiconductor chip. The microelectronic element 102 can be adapted to function as a memory device, a processing unit or some other type of device.

The first and second terminals 116, 118 are arranged on the first surface 110 of the substrate 108 such that they will align with mating contacts 136 exposed at a surface 138 of the circuit board 106 facing the microelectronic connection component 104. In the illustrated implementation, the first and second terminals 116, 118 are bonded to the mating contacts 136 they are aligned to with solder balls 140.

An adhesive material 142 is between the microelectronic element 102 and the microelectronic connection component 104. In certain implementations the adhesive material is a compliant material. In some implementations the adhesive material has dielectric properties. The adhesive material 142 can be formed by applying a flowable material, such as a liquid or gelatinous composition, into the space between the microelectronic element 102 and the microelectronic connection component 104. Once applied, the flowable material can be cured to form the adhesive material.

In some implementations, the flowable material is an elastomer, such as silicone or epoxy. The adhesive material could be formed from a rigid polymer material if desired.

Figure 2:
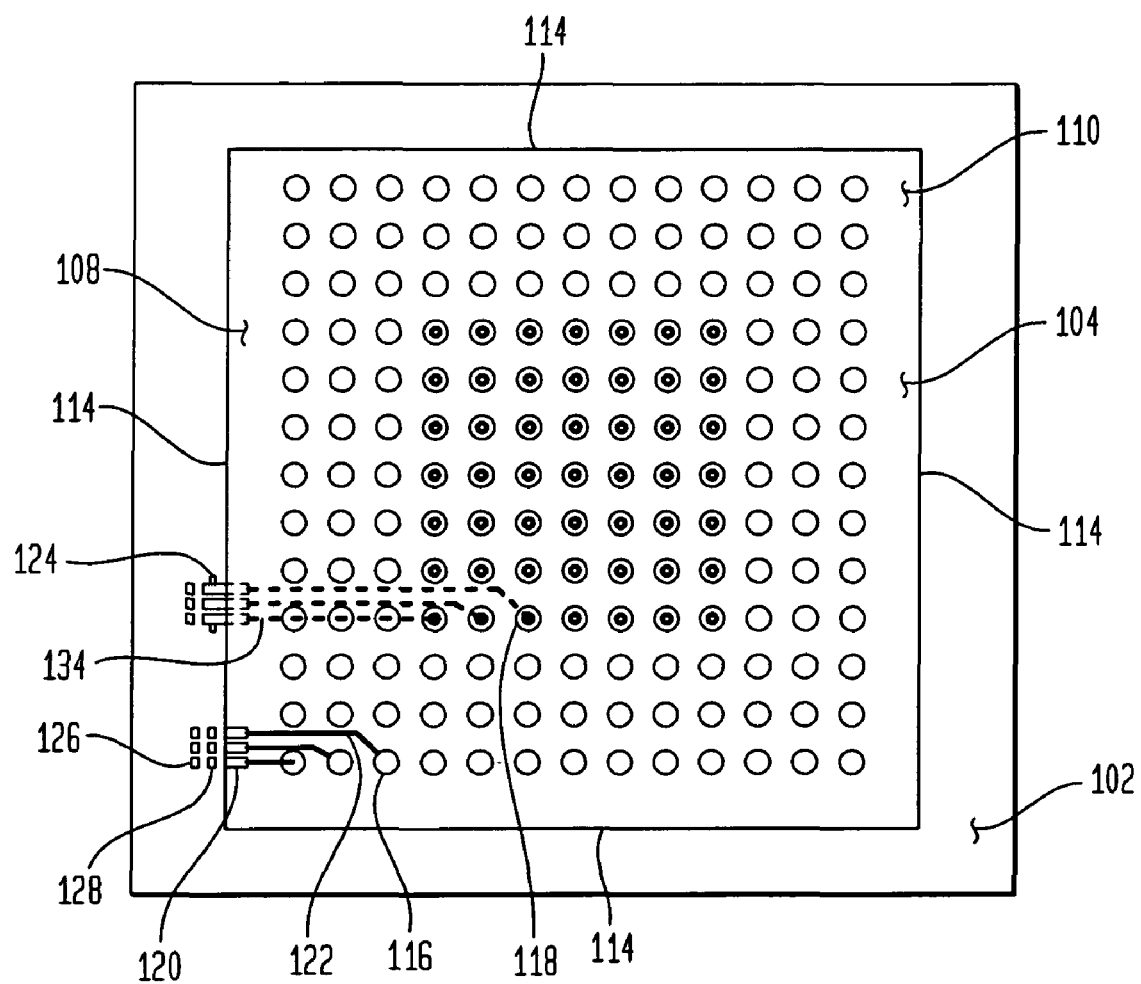
FIG. 2 is a diagrammatic plan view of a microelectronic connection component coupled to a microelectronic element.

FIG. 2 is a diagrammatic sectional view of the microelectronic connection component 104 positioned above a microelectronic element 102.

The illustrated microelectronic connection component 104 includes an array of first terminals 116 (identified as empty circles) and second terminals 118 (identified as circles with a spot inside) exposed at the first surface 110 of the substrate 108. Conductive traces 122 extend along the first surface 110 from first terminals 116 to associated wire bond pads 120 located at peripheral edges 114 of the first surface 110. For clarity purposes, only three of those conductive traces 122 and three bond pads 120 are shown. However, in a typical implementation, all of the illustrated first terminals 116 would be connected to associated bond pads 120 in a similar manner. Also, in a typical implementation, wire bond pads 120 would be provided in rows proximate each of the peripheral edges 114.

According to the illustrated implementation, conductive traces 134 (shown as dashed lines) extend along the second surface (e.g., second surface 112 of FIG. 1) of the substrate 108 opposite the first surface 110. Those conductive traces 134 couple the second terminals 118 to associated bonding leads 124 that extend beyond peripheral edges 114 of the substrate 108. Again for clarity purposes only three conductive traces 134 and three bonding leads 124 are shown. However, in a typical implementation, all of the illustrated second terminals 118 would be connected to associated bonding leads 124 in a similar manner and bonding leads 124 would extend beyond each of the peripheral edges 114. In one implementation, plated through holes (e.g., 132 in FIG. 1) extend from the second terminals 118 (into the page) to the conductive traces 134.

Bonding lead contacts 128 are exposed at the upper surface of the illustrated microelectronic element 104. Those bonding lead contacts 128 are arranged in a row adjacent the peripheral edge 114 of the substrate 108. For clarity purposes, only a small number of bonding lead contacts 128 are shown. However, a typical implementation would include bonding lead contacts 128 arranged in rows that extend almost entirely along each of the peripheral edges 114. The bonding leads 124 are adapted to flex toward the bonding lead contacts 128 and be bonded thereto.

Wire bond contacts 126 also are exposed at an upper surface of the illustrated microelectronic element 102. Those wire bond contacts 126 are arranged in a row substantially parallel to the row of bonding lead contacts 128. For clarity purposes, only a small number of wire bond contacts 126 are shown. However, a typical implementation would include wire bond contacts 126 arranged in rows that extend almost entirely along each of the peripheral edges 114, with each row of wire bond contacts 126 disposed approximately parallel to an associated row of bonding lead contacts 128.

According to the illustrated implementation, the second terminals 118 are arranged in a group that is approximately centrally located on the first surface 110 of the substrate 108. The first terminals 116 surround that group of second terminals 118.

Figure 3:
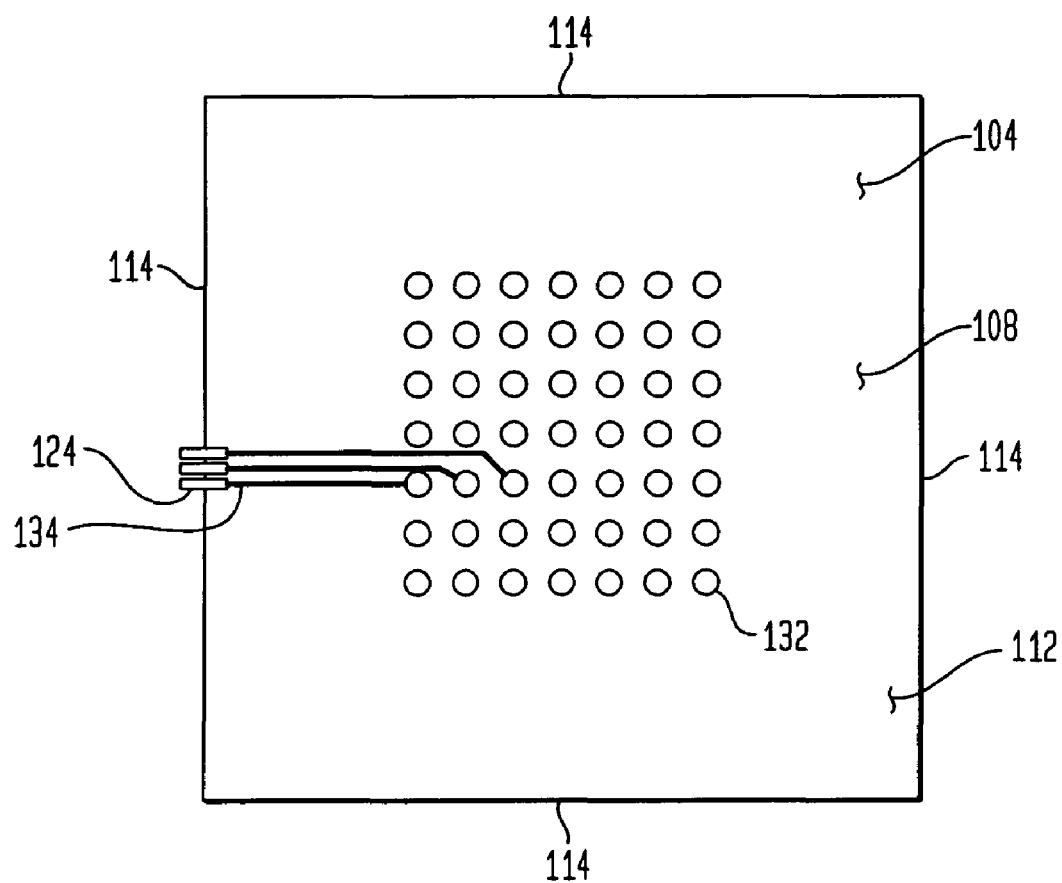
FIG. 3 is a partial plan view of microelectronic connection component.

FIG. 3 is a diagrammatic partial plan view showing the second surface 112 (opposite first surface 110 of FIG. 2) of a microelectronic connection component 104.

The illustrated microelectronic connection component 104 includes an array of plated through holes 132 exposed at the second surface 112. Conductive traces 134 extend from the plated through holes 132 to the bonding leads 124 that project beyond the peripheral edge 114 of the substrate 108. For clarity purposes only a small number of conductive traces 134 and bonding leads 124 are shown. However, a typical implementation would include conductive traces 134 electrically coupling every plated through hole 132 to an associated bonding leads 124 at peripheral edges 114 of the substrate 108.

Figure 4:
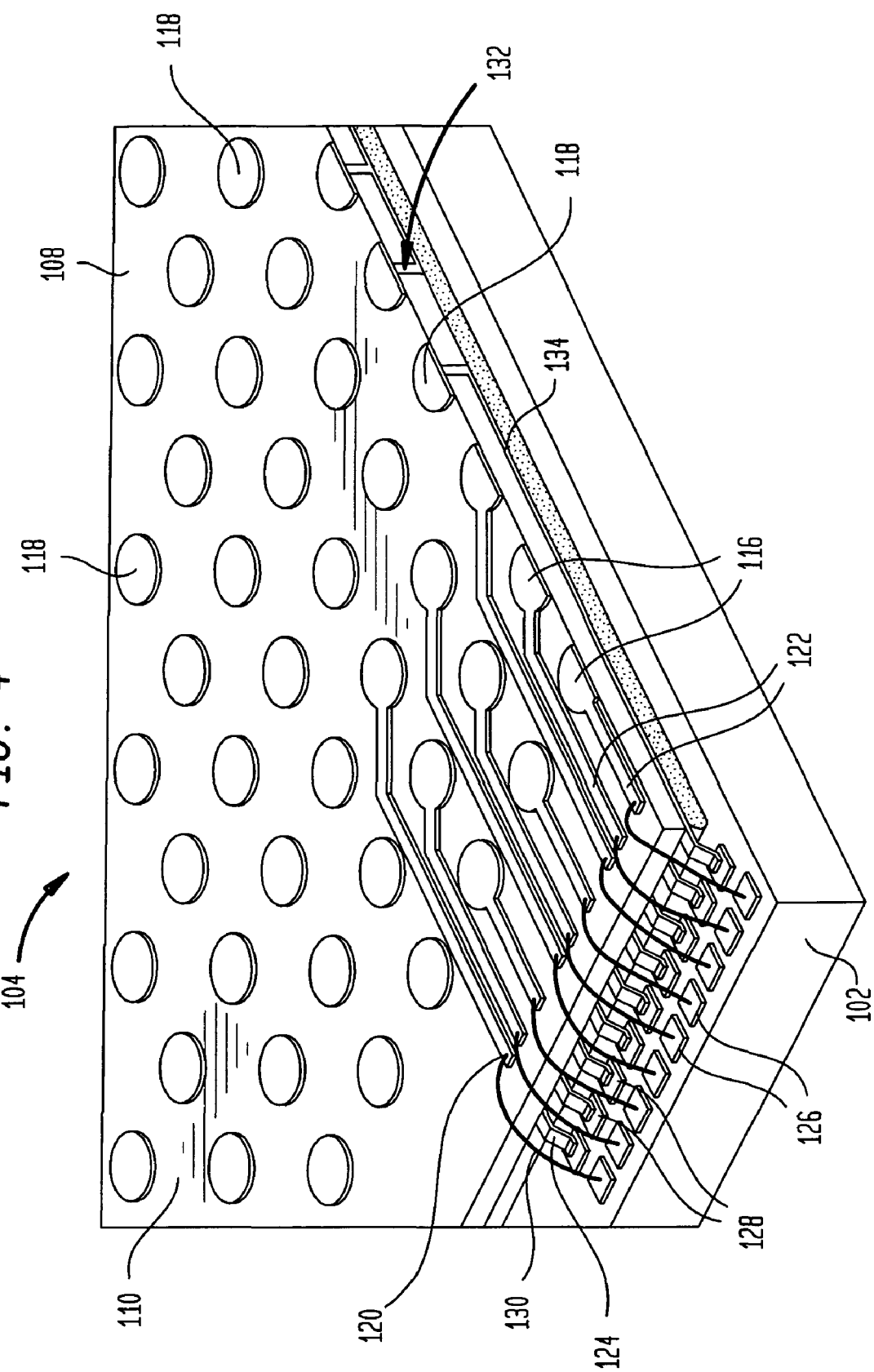
FIG. 4 is a partial perspective, partial cutaway view of a microelectronic connection component coupled to a microelectronic element.

FIG. 4 is a partial perspective, partial cutaway view of the microelectronic connection component 104 positioned atop the microelectronic element 102.

The illustrated microelectronic connection component 104 includes first and second terminals 116, 118 exposed at the first surface 110 of the substrate 108. Conductive traces 122 extend along the first surface 110 from the first terminals 116 to associated wire bond pads 120 that are positioned proximate a peripheral edge of the first surface 110. Wire bonds 130 couple the wire bond pads 120 to wire bond contacts 126 on a surface of the microelectronic element 102.

In the cutaway portion of the illustrated implementation, it can be seen that plated through holes 132 extend downward from the second terminals 118 through the substrate 108. Conductive traces 134 extend along a second (i.e., lower) surface of the substrate 108 from the plated through holes 132 to associated bonding leads 124. The bonding leads 124 are bent to form a downward step to touch associated bonding lead contacts 128 exposed at a surface of the microelectronic element 102.

Figure 5:
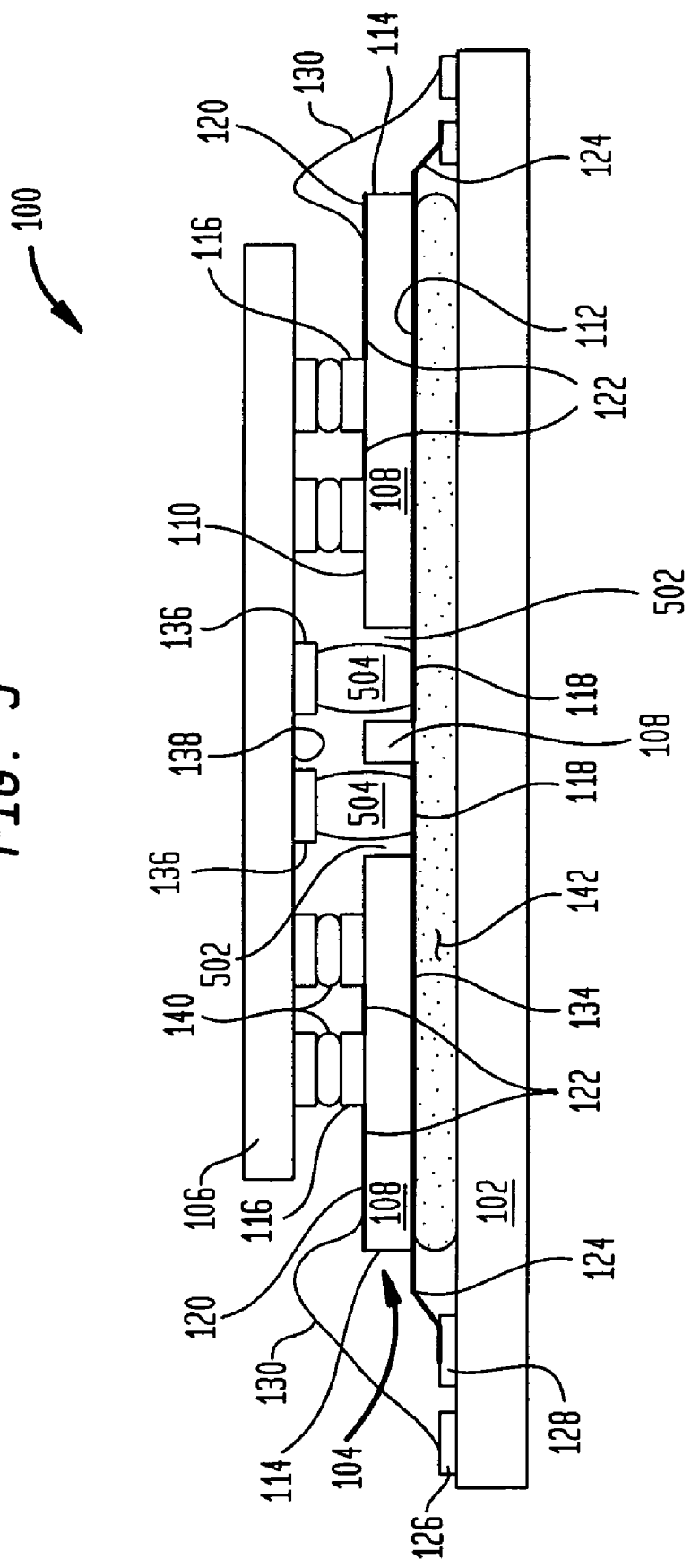
FIG. 5 is a sectional view of a microelectronic assembly.

FIG. 5 is a sectional view of an alternative implementation of a microelectronic assembly 100.

In the illustrated implementation, the second terminals 118 are physically coupled to the second surface 112 of the substrate 108. Nevertheless, those second terminals 118 are exposed at the first surface 110 through openings 502 that extend through the substrate 108. A solder ball 504 is positioned in each of those openings 502 and extends from its associated second terminal 118 to associated mating contacts 136 on the circuit board 106. The illustrated second terminals 118 are integrally formed as parts of the conductive traces 134 that extend along the second surface of the substrate 108.

As used in this disclosure, a statement that an electrically conductive structure is "exposed at" a surface of a dielectric structure indicates at least that the electrically conductive structure is available for contact with a theoretical point moving in a direction perpendicular to the surface of the dielectric structure toward the surface of the dielectric structure from outside the dielectric structure. Thus, a terminal or other conductive structure which is exposed at a surface of a dielectric structure may project from such surface; may be flush with such surface; or may be recessed relative to such surface and exposed through a hole or depression in the dielectric.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

For example, the first terminals and the second terminals can be disposed in any pattern on the first and/or second surfaces of the substrate. Portions of the conductive traces can pass inside or through the substrate. Traces can be routed on the substrate in a number of different patterns. Bonding leads can extend from surfaces other than the second surface. Wire bond pads can be exposed at locations displaced from the peripheral edges of the substrate. Other through holes may be provided. Various conductive and non-conductive structures can be integrally formed. A variety of materials can be used to form the various elements disclosed herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

Accordingly, other implementations are within the scope of the following claims.

What is claimed is:

1. A microelectronic connection component comprising:
    a substrate having a first surface, a second surface and a peripheral edge;
    first terminals and second terminals, the first and second terminals being exposed at the first surface of the substrate;
    wire bond pads exposed proximate the peripheral edge of the substrate at the first surface;
    first conductive paths that couple the first terminals to the wire bond pads;
    a plurality of bonding leads extending along the substrate and extending beyond the peripheral edge of the substrate; and
    second conductive paths that couple the second terminals to the bonding leads, the second conductive paths including a plurality of spaced apart conductive traces extending along the second surface of the substrate, conductive traces being connected to the bonding leads.

2. The microelectronic connection component of claim 1 wherein the bonding leads are disposed on and extend from the second surface of the substrate.

3. The microelectronic connection component of claim 2, wherein the second terminals are disposed on the first surface,
    wherein the second conductive paths further comprise vertical conductors coupled to the second terminals and extending through the substrate; and
    wherein the plurality of conductive traces extend between the vertical conductors and the bonding leads.

4. The microelectronic connection component of claim 2, wherein the second terminals are disposed on the second surface of the substrate and wherein the second conductive paths comprise conductive traces that extend along the second surface of the substrate from the second terminals to the bonding leads.

5. The microelectronic connection component of claim 1 wherein the second conductive paths comprise conductive traces disposed on the second surface of the substrate.

6. The microelectronic connection component of claim 1 wherein the first conductive paths comprise conductive traces disposed on the first surface of the substrate.

7. The microelectronic connection component of claim 1 wherein at least some of the first terminals are disposed on the first surface at a position between at least some of the second terminals and at least some of the wire bond pads.

8. The microelectronic connection component of claim 1 wherein a plurality of the second terminals and at least some of the first terminals surround at least some of the second terminals on the first surface of the substrate.

9. The microelectronic connection component of claim 8 wherein at least some of the wire bond pads surround at least some of the first terminals on the first surface of the substrate.

10. The microelectronic connection component of claim 1 wherein the substrate comprises a dielectric material.

11. The microelectronic connection component of claim 1 wherein the bonding leads are adapted to flex in a direction transverse to the surfaces of the substrate.

12. The microelectronic connection component of claim 1 wherein the first and second terminals are arranged so as to align with and be coupled to mating contacts exposed at a surface of a circuit board coupled to the microelectronic connection component.

13. A microelectronic assembly comprising:
   the microelectronic connection component as claimed in claim 1;
   a microelectronic element coupled to the microelectronic connection component, the microelectronic element comprising:
   wire bond contacts; and
   bonding lead contacts adjacent the wire bond contacts;
   wherein the wire bond pads are electrically coupled to the wire bond contacts and the bonding leads are electrically coupled to the bonding lead contacts.

14. The microelectronic assembly of claim 13 further comprising wire bonds coupling the wire bond pads to the wire bond contacts.

15. The microelectronic assembly of claim 13 wherein the bonding leads are disposed on and extend from the second surface of the substrate and are bent to touch the bonding lead contacts.

16. The microelectronic assembly of claim 13 wherein the wire bond contacts and the bonding lead contacts respectively form rows that are substantially parallel.

17. The microelectronic assembly of claim 13 wherein the microelectronic element is a semiconductor device.

18. The microelectronic assembly of claim 13 further comprising:
   a circuit board coupled to the microelectronic connection component,
   wherein the first and second terminals are aligned with and coupled to mating contacts exposed at a surface of the circuit board.

19. A microelectronic connection component of claim 1, wherein the substrate includes a dielectric material.

20. A microelectronic connection component of claim 1, wherein the bonding leads are spaced apart from each other.

21. A microelectronic connection component of claim 1, wherein at least portions of the bonding leads extend along the second surface.

\* \* \* \* \*